(12) United States Patent
Hong et al.

(10) Patent No.: US 8,008,981 B2
(45) Date of Patent: Aug. 30, 2011

(54) MULTI-PHASE ULTRA-WIDEBAND SIGNAL GENERATOR USING DIFFERENTIAL PULSE OSCILLATORS AND ARRAY THEREOF

(75) Inventors: Seong Cheol Hong, Daejon (KR); Sang Hoon Sim, Seoul (KR)

(73) Assignee: Korea Advanced Institute of Science and Technology (KR)

( * ) Notice: Subject to any disclaimer, the term of this patent is extended or adjusted under 35 U.S.C. 154(b) by 43 days.

(21) Appl. No.: 12/686,410

(22) Filed: Jan. 13, 2010

(65) Prior Publication Data
US 2010/0182065 A1    Jul. 22, 2010

(30) Foreign Application Priority Data

Jan. 21, 2009  (KR) .................. 10-2009-0004993
Nov. 20, 2009  (KR) .................. 10-2009-0112667

(51) Int. Cl.
| | |
|---|---|
| H03B 5/08 | (2006.01) |
| H03B 5/12 | (2006.01) |
| H03B 27/00 | (2006.01) |
| H03C 3/00 | (2006.01) |
| H03L 7/24 | (2006.01) |
| H04L 27/20 | (2006.01) |

(52) U.S. Cl. .............. 331/173; 331/45; 331/46; 331/55; 331/117 R; 331/117 FE; 332/103; 332/104; 332/105; 375/308

(58) Field of Classification Search .......... 332/103–105; 331/45, 46, 50, 55, 57, 116 R, 116 FE, 116 M, 331/117 R, 117 FE, 117 D, 172, 173; 375/302, 375/308
See application file for complete search history.

(56) References Cited

U.S. PATENT DOCUMENTS
2003/0151465 A1*  8/2003  Wood .................. 331/107 SL
2010/0085122 A1*  4/2010  Carbone et al. ............. 331/45
* cited by examiner

*Primary Examiner* — David Mis
(74) *Attorney, Agent, or Firm* — Hershkovitz & Associates, LLC; Abraham Hershkovitz

(57) ABSTRACT

A multi-phase ultra-wideband signal generator uses differential pulse oscillators. The multi-phase ultra-wideband signal generator using differential pulse oscillators includes N pulse oscillators for generating pulse signals based on a supply of power, and further comprises N inverting amplification units for outputting inverted amplified signals of output signals of the N pulse oscillators when a number of pulse oscillators is at least two, wherein, when the number of pulse oscillators is an even or odd number, the pulse oscillators are arrayed such that they have a connection form in which output terminals OUT(+) and OUT(−) of a relevant pulse oscillator are connected to output terminals OUT(+) and OUT(−) of a next pulse oscillator through a relevant inverting amplification unit, and the connection form is consecutively applied to the pulse oscillators.

12 Claims, 15 Drawing Sheets

| OSC$_{400a}$,OSC$_{400b}$ | 0,0 | 0,1 | 1,0 | 1,1 |
|---|---|---|---|---|
| OUT(+)$_{400a}$ | 0° | −90° | 90° | 180° |
| OUT(−)$_{400a}$ | 180° | 90° | −90° | 0° |
| OUT(+)$_{400b}$ | −90° | 180° | 0° | 90° |
| OUT(−)$_{400b}$ | 90° | 0° | 180° | −90° |

# MULTI-PHASE ULTRA-WIDEBAND SIGNAL GENERATOR USING DIFFERENTIAL PULSE OSCILLATORS AND ARRAY THEREOF

CROSS-REFERENCE TO RELATED APPLICATIONS

The present application claims priority to Korean Patent Application No. 10-2009-0004993, filed on Jan. 21, 2009, and Korean Patent Application No. 10-2009-0112667, filed Nov. 20, 2009, the disclosures of which are expressly incorporated by reference in their entireties.

BACKGROUND OF THE INVENTION

1. Field of the Invention

The present invention relates, in general, to ultra-wideband signal generators, and more particularly, to technology related to a scheme for asynchronously regulating the equivalent half circuits of each of the differential pulse oscillators, and configuring the differential pulse oscillators into the form of an array for the purpose of generating multi-phase pulses and performing Phase Shift Keying (PSK) modulation when ultra-wideband signals are generated using the differential pulse oscillators and an array thereof.

2. Description of the Related Art

Ultra-wideband radio technology enables low-power operations due to a short pulse operation, and enables the implementation of a position tracking system requiring high-speed communication or high precision through the use of a wide bandwidth, and thus, research into ultra-wideband radio technology has recently been actively conducted. When transmission or reception is performed using a pulse, several problems occur due to the interference between signals or the periodic repetition of a pulse unless the pulse is modulated. In order to effectively transmit data and extract target information in a radar system or a communication system, at least Quadrature Phase Shift Keying (QPSK) or M-ary phase shift keying (M-PSK) is required.

As shown in FIG. 1, a conventional process of generating an ultra-wideband pulse and modulating the pulse using Binary Phase Shift Keying (BPSK) modulation is performed to generate ultra-wideband signals 104a and 104b in such a way as to allow signals 101a and 101b output from a differential sine wave generator 101, which is continuously operating, to pass through relevant switches only for a predetermined time (τ), using switches 102 and 103 and switch control signals 102a and 103a.

Here, when the sine wave generator 101 has a differential structure, oscillation signals 101a and 101b have phases of (+) and (−). Accordingly, when signals are output using the switch 102 corresponding to a positive (+) signal, the signal at an output terminal 104 is a positive (+) pulse 104a. Further, when signals are output using the switch 103 corresponding to a negative (−) signal, the signal at the output terminal 104 is a negative (−) pulse 104b. Through this operation, BPSK modulation may be performed.

As shown in FIG. 2, a conventional process of generating an ultra-wideband pulse and modulating the pulse using QPSK is performed to generate ultra-wideband signals 208, 209, 210 and 211 in such a way as to allow signals 201a, 201b, 201c, and 201d output from a quadrature sine wave generator 201, which is continuously operating, to pass through relevant switches only for a predetermined period of time (τ) using switches 202, 203, 204 and 205 and a switch control signal 207. In this case, as shown in FIG. 2, the quadrature sine wave generator 201 may be implemented as an array of two differential oscillators and four inverting amplifiers.

The oscillation signals 201a, 201b, 201c and 201d of the quadrature sine wave generator 201 have phases of 0°, 90°, 180° and 270°, respectively. Therefore, when a signal is output using the switch 202 corresponding to a signal having a phase of 0°, the signal at an output terminal 206 is a pulse 208 having a phase of 0°. Further, when a signal is output using the switch 203 corresponding to a signal having a phase of 90°, the signal at the output terminal 206 is a pulse 209 having a phase of 90°. When a signal is output using the switch 204 corresponding to a signal having a phase of 180°, the signal at the output terminal 206 is a pulse 210 having a phase of 180°. When a signal is output using the switch 205 corresponding to a signal having a phase of 270°, the signal at the output terminal 206 is a pulse 211 having a phase of 270°. Therefore, when these pulses are used, QPSK modulation can be performed.

Such a conventional ultra-wideband pulse generator is problematic in that power efficiency deteriorates due to the insertion loss of the switch units 102, 103, 202, 203, 204, and 205, and in that additional power loss may occur when the switch units are implemented in the form of active amplifiers so as to compensate for the insertion loss of the switch units.

SUMMARY OF THE INVENTION

Accordingly, the present invention has been made keeping in mind the above problems occurring in the prior art, and an aspect of the present invention can provide a multi-phase ultra-wideband signal generator which asynchronously regulates the equivalent half circuits of each of the differential pulse oscillators using asynchronous control signals when ultra-wideband signals are generated using the differential pulse oscillators and an array thereof, thus maximizing the transient response speed of the oscillators, and which interchanges the control sequence of the asynchronous control signals, thus performing PSK modulation without requiring a separate modulator.

The present invention can provide a multi-phase ultra-wideband signal generator using differential pulse oscillators and an array thereof, comprising N pulse oscillators for generating pulse signals based on a supply of power, and further comprising N inverting amplification units for respectively outputting inverted amplified signals of output signals of the N pulse oscillators when a number of pulse oscillators is at least two. When the number of pulse oscillators is an even number, the pulse oscillators are arrayed such that they have a connection form in which output terminals OUT(+) and OUT(−) of a relevant pulse oscillator are respectively connected to output terminals OUT(+) and OUT(−) of a next pulse oscillator through a relevant inverting amplification unit, and the connection form is consecutively applied to the pulse oscillators ranging from a first pulse oscillator to a last pulse oscillator, such that the output terminals OUT(+) and OUT(−) of the last pulse oscillator are respectively connected to output terminals OUT (−) and OUT(+) of the first pulse oscillator through a relevant inverting amplification unit. When the number of pulse oscillators is an odd number greater than 1, the pulse oscillators are arrayed such that they have a connection form in which output terminals OUT(+) and OUT(−) of a relevant pulse oscillator are respectively connected to output terminals OUT(+) and OUT(−) of a next pulse oscillator through a relevant inverting amplification unit, and the connection form is consecutively applied to the pulse oscillators ranging from a first pulse oscillator to a last pulse oscillator, such that the output terminals OUT(+) and OUT(−) of the last pulse oscillator are respectively connected to output terminals OUT(+) and OUT(−) of the first pulse oscillator through a relevant inverting amplification unit.

DESCRIPTION OF THE PREFERRED EMBODIMENTS

The above and other aspects, features and advantages of the present invention will be more clearly understood from the following detailed description taken in conjunction with the accompanying drawings. In the following description of the present invention, if detailed descriptions of related well-known constructions or functions are determined to make the gist of the present invention unclear, the detailed descriptions will be omitted.

Hereinafter, embodiments of the present invention will be described in detail with reference to the attached drawings.

A multi-phase ultra-wideband signal generator (hereinafter referred to as an "ultra-wideband signal generator") 300 using differential pulse oscillators and an array thereof according to the present invention will be described in detail with reference to FIGS. 3 to 15.

Figure 1:
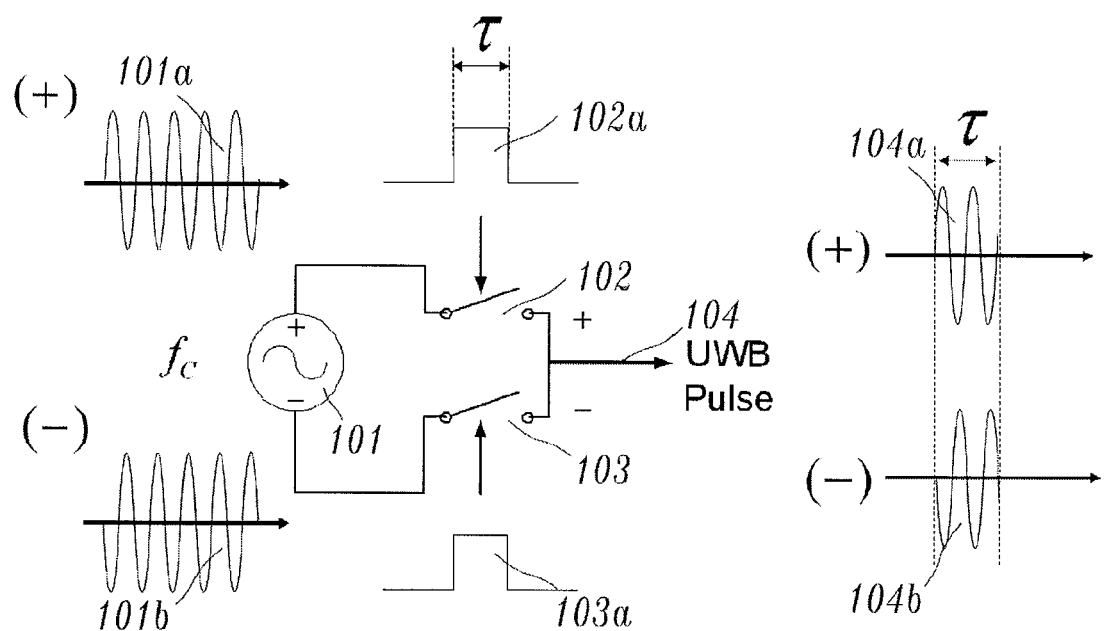
FIG. 1 is a diagram showing an example of a conventional process for generating an ultra-wideband pulse and performing BPSK modulation.
Figure 2:
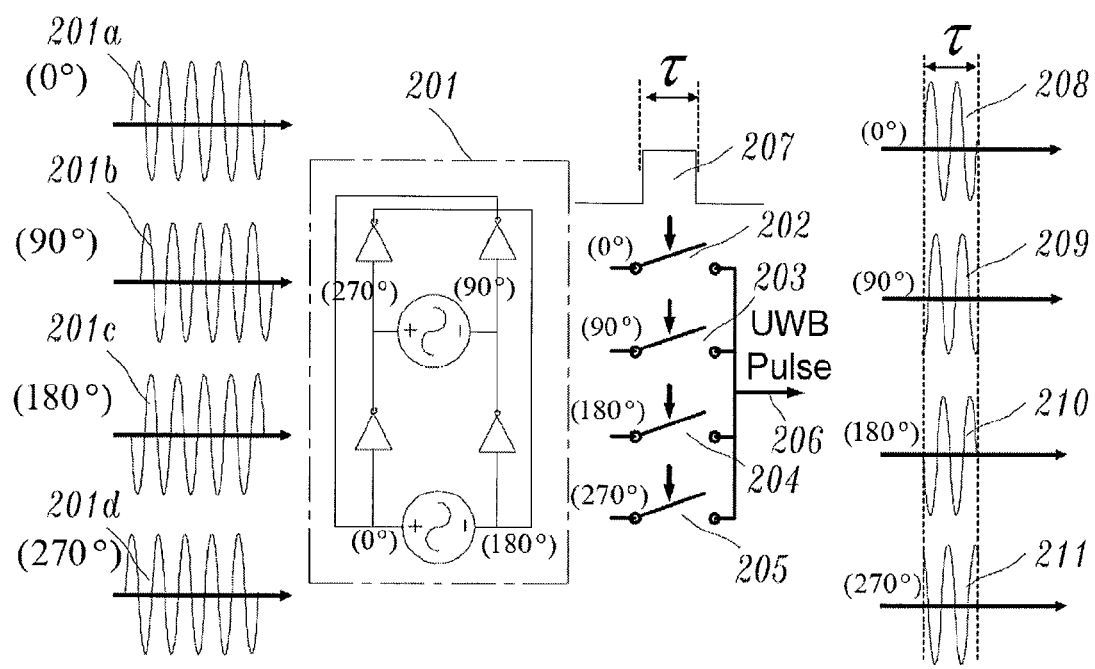
FIG. 2 is a diagram showing an example of a conventional process for generating an ultra-wideband pulse and performing QPSK modulation.
Figure 3:
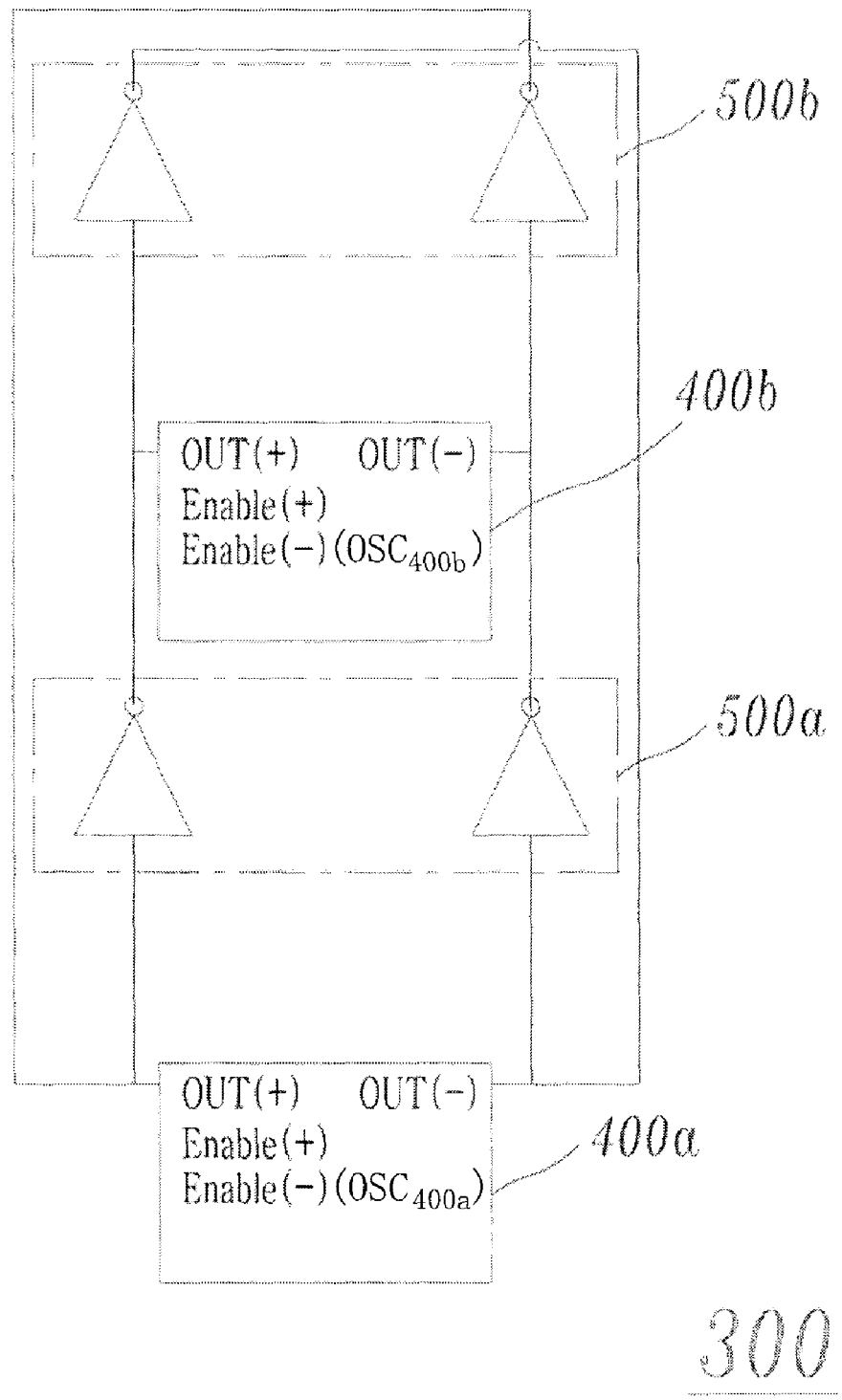
FIG. 3 is a diagram showing the construction of a multi-phase ultra-wideband signal generator using differential pulse oscillators and an array thereof according to an embodiment of the present invention.
Figure 4:
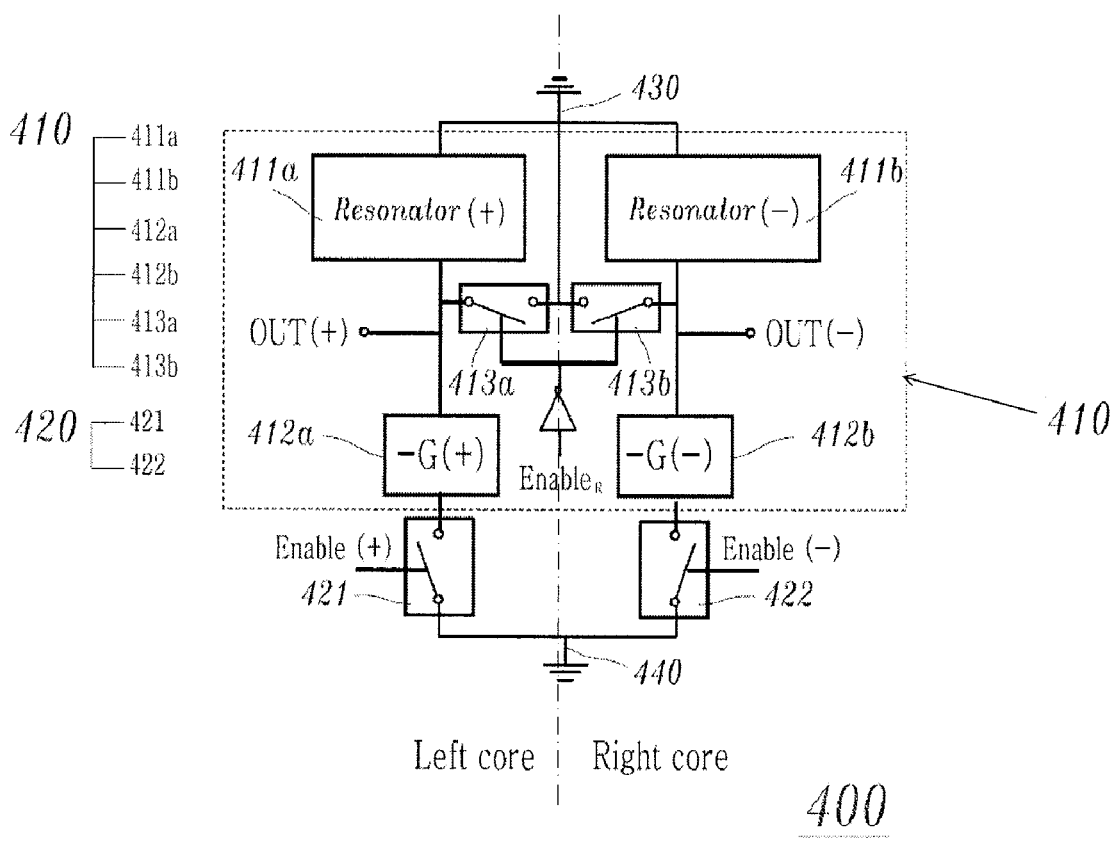
FIG. 4 is a diagram showing the construction of a differential pulse oscillator according to an embodiment of the present invention.

FIG. 3 is a diagram showing the overall construction of the ultra-wideband signal generator 300 according to the present invention, and FIG. 4 is a diagram showing a differential pulse oscillator 400 which is a basic unit of the ultra-wideband signal generator 300 of FIG. 3.

First, the differential pulse oscillator 400, which is the basic unit of the ultra-wideband signal generator 300 according to the present invention, will be described below.

As shown in FIG. 4, the differential pulse oscillator 400 includes an oscillator unit 410 which includes a resonator 411 (not shown separately) including resonators 411a and 411b and a negative conductance (−G) generator 412 (not shown separately) including generators 412a and 412b, and generates a pulse signal based on the supply of power. The differential pulse oscillator 400 also includes a first switch unit 420 not separately shown) including switches 421 and 422 for controlling power to be supplied to the oscillator unit 410.

Here, the first switch unit 420 (including switches 421 and 422) is an active element switch or a passive element switch. The oscillator unit 410 is comprised of equivalent half circuits (that is, a left core and a right core) around an actual or virtual AC ground 430 or 440. Power components to be supplied to the left core and the right core are respectively controlled by the two switches 421 and 422 of the first switch unit 420.

The oscillator unit 410 can include a second switch unit 413 (not separately shown) including switches 413a and 413b connected between the resonators 411a and 411b and the negative conductance generators 412a and 412b so as to bypass the resonators 411a and 411b, and configured to reduce a ringing component attributable to a switching operation or improve the response speed at the time of performing switching.

The flow of signal generation performed by the differential pulse oscillator 400 having the above construction will be described below.

Initially, when the first switches 421 and 422 are controlled so that the power to the oscillator unit 410 is supplied only for a predetermined period of time, pulse-shaped signals are generated.

In this case, the polarities of pulse signals output from output terminals OUT(+) and OUT(−) can be changed depending on control signals input to the control terminals Enable(+) and Enable(−) of the first switches 421 and 422. That is, depending on the control signals at the control terminals Enable(+) and Enable (−), it is possible for the phase of the output signal from the output terminal OUT(+) to be 0° and the phase of the output signal from the output terminal OUT(−) to be 180°, and it is also possible for the phase of the output signal from the output terminal OUT(+) to be 180° and the phase of the signal from the output terminal OUT(−) to be 0°.

In the present invention, the signals of the pulse oscillator, which have a phase difference of 180° therebetween, are distinguished from each other by "+" and "−".

Figure 5:
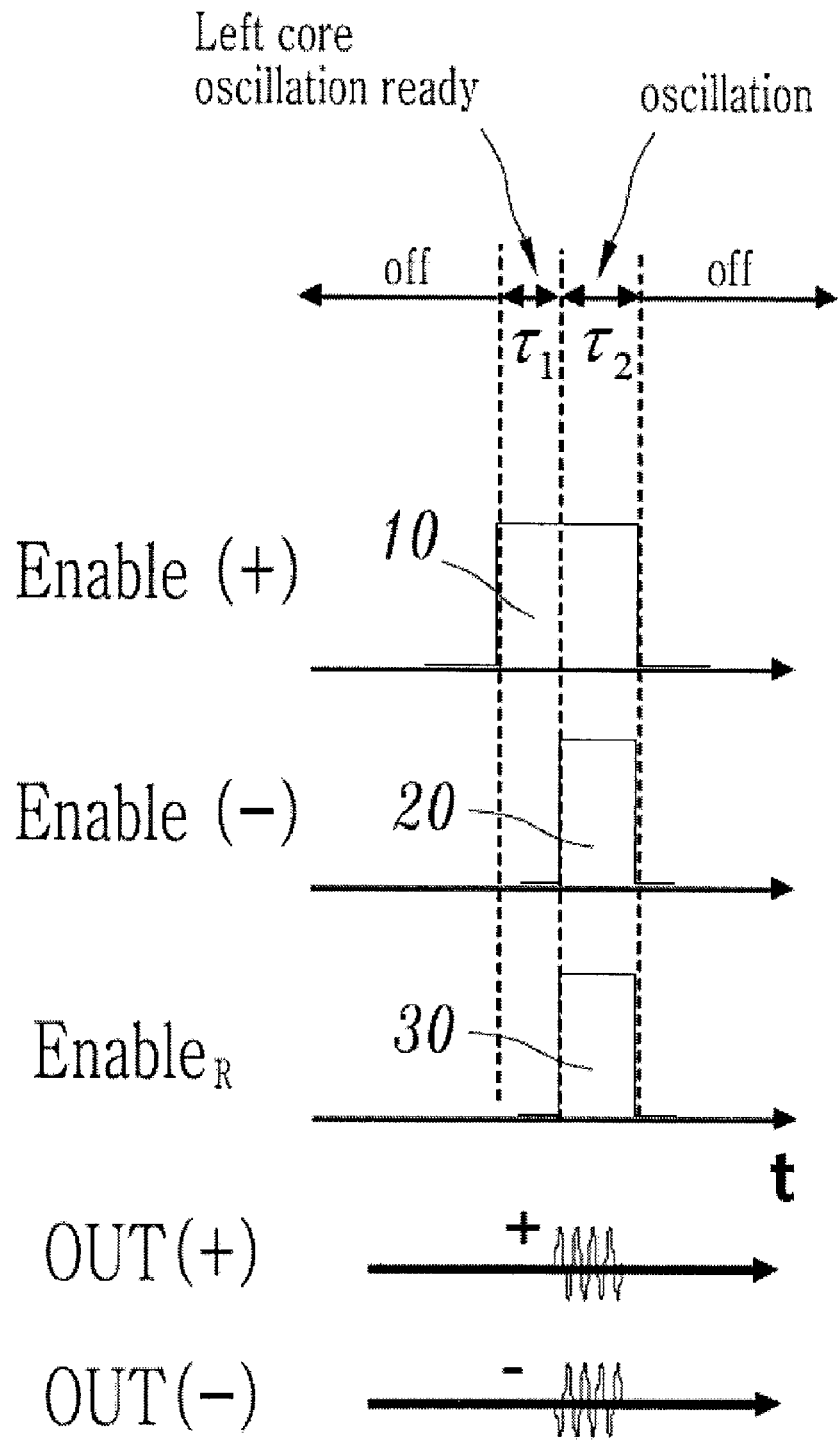
FIGS. 5 and 6 are diagrams showing examples of the control signals of the differential pulse oscillator according to an embodiment of the present invention.
Figure 6:
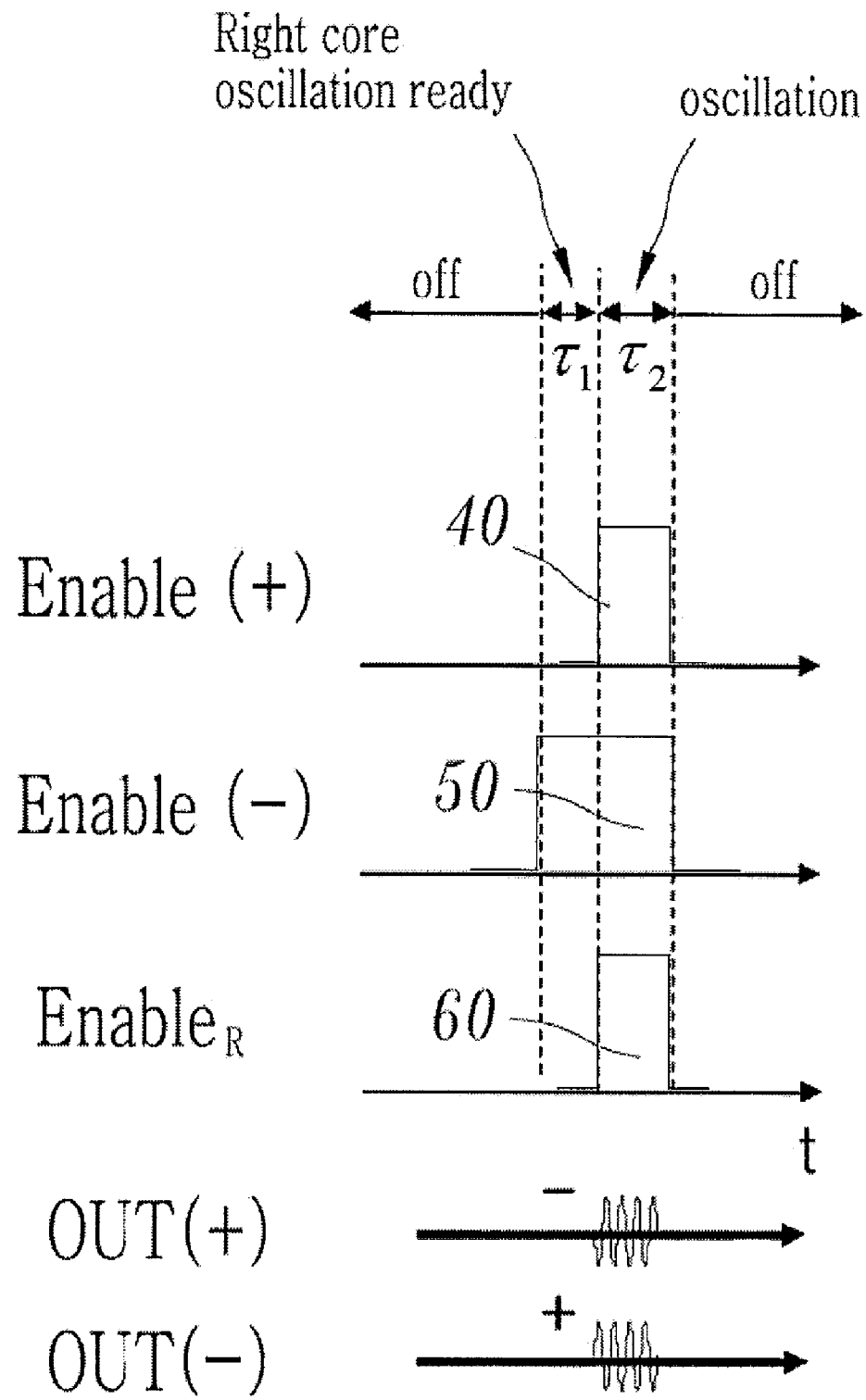

FIGS. 5 and 6 illustrate signals input to terminals Enable (+) and Enable (−).

There are three states, that is, "off", "oscillation ready" and "oscillation" depending on the control signals. The state "oscillation ready" is divided into the state "left core oscillation ready" and the state "right core oscillation ready," which are shown in FIGS. 5 and 6, respectively.

Also as shown in FIGS. 5 and 6, in the state "off," the switches 421 and 422 of the first switch unit are turned off and the switches 413a and 413b of the second switch unit are turned on.

In this case, since current flows through neither the left core on the side of OUT(+) nor the right core on the side of OUT(−), and negative conductance for oscillation does not occur, the oscillator unit cannot oscillate.

In the state "left core oscillation ready" ($\tau_1$) of FIG. 5, the switch 421 of the first switch unit is turned on (10) and the switch 422 of the first switch unit is turned off (20).

Since the left and right cores of the differential pulse oscillator 400 are arranged around the (actual or virtual) AC ground on the basis of the principle of operation, both the left and right cores must have negative conductance (−G) so as to allow the differential pulse oscillator to oscillate.

Therefore, with regard to the control signals of FIG. 5, in the state "left core oscillation ready" ($\tau_1$), the left core enters the state in which current flows therethrough, but the right core is still turned off by the switch 422. As a result, oscillating conditions cannot be satisfied, and the oscillator unit cannot oscillate.

In this case, the switches 413a and 413b of the second switch unit are turned on (30) and are configured to bypass the resonators 411a and 411b to the AC ground, and thus a ringing component that may be generated at the time of performing switching is eliminated.

Meanwhile, in the state "right core oscillation ready" ($\tau_1$) of FIG. 6, the switch 421 of the first switch unit is turned off (40), and the switch 422 is turned on (50).

Considering that, in order for the differential pulse oscillator to oscillate, both the left and right cores must have negative conductance (−G), the right core enters the state in which current flows therethrough, but the left core is still turned off by the switch 421. As a result, oscillating conditions cannot be satisfied, and the oscillator unit cannot oscillate. In this case, similarly to the state "left core oscillation ready," the switches 413a and 413b of the second switch unit are turned on (60) and are configured to bypass the resonators 411a and 411b to the AC ground. Therefore, a ringing component that may be generated at the time of performing switching is eliminated.

The state "oscillation" may be divided into the case where, as shown in FIG. 5, the state "oscillation" is made in the state "left core oscillation ready," and the case where, as shown in FIG. 6, the state "oscillation" is made in the state "right core oscillation ready."

In the two cases, since oscillation occurs as initial oscillation conditions are interchanged between the left core and the right core, the phases of the oscillation signals are also interchanged between the left and right cores. In this case, because the oscillation signals exhibit a phase difference of 180° therebetween due to the characteristics of the differential pulse oscillator, the polarities of the oscillation signals are also opposite to each other.

Therefore, in FIG. 5, oscillation occurs while power is supplied to the right core at the moment at which oscillation is started. In FIG. 6, oscillation occurs while power is supplied to the left core at the moment at which oscillation is started. Further, the oscillator performs a differential operation, so that oscillation signals having different polarities are generated in response to the control signals shown in FIGS. 5 and 6.

That is, the phase of the signal output from the output terminal OUT(+) (or OUT(−)) when the control signals of FIG. 5 are applied to the differential structure of FIG. 4 has a phase difference of 180° with respect to the phase of the signal output from the output terminal OUT(+) (or OUT(−)) when the control signals of FIG. 6 are applied thereto. Therefore, when the asynchronous control signals of FIGS. 5 and 6 are used together with the differential structure of FIG. 4, BPSK modulation can be performed without requiring a separate modulator.

Further, the asynchronous control signals of FIGS. 5 and 6 according to the present invention are advantageous in that the transient response speed of the differential pulse oscillator is maximized in the initial stage of oscillation. This is due to the fact that, when disturbance simultaneously occurs in both stages of the equivalent half circuits (left core and right core) in the case of the differential pulse oscillator, the differential pulse oscillator of the present invention has operating characteristics suppressing such a disturbance. Thus, the problem of simultaneous disturbance of the half circuits can be solved by using asynchronous control signals, as described above.

The ultra-wideband signal generator 300 according to the present invention includes N pulse oscillators 400 for generating pulse signals based on the supply of power, and N inverting amplification units 500 for respectively outputting inverted amplified signals of the output signals of the N pulse oscillators 400.

Further, the differential pulse oscillators for QPSK modulation can be configured in the form of an array as in FIG. 3.

In this case, when there is one pulse oscillator 400, the inverting amplification units 500 are not required. However, when the number of pulse oscillators 400 is at least two, N inverting amplification units 500 for respectively outputting inverted amplified signals of the output signals of N pulse oscillators are required so that the pulse oscillators 400 can be configured in the form of an array.

That is, as shown in FIG. 3, the output terminals OUT(+) and OUT(−) of the first pulse oscillator 400a are respectively connected to the output terminals OUT(+) and OUT(−) of the second pulse oscillator 400b through the first inverting amplification unit 500a. The output terminals OUT(+) and OUT (−) of the second pulse oscillator 400b are respectively connected to the output terminals OUT(−) and OUT(+) of the first pulse oscillator 400a through the second inverting amplification unit 500b.

In this case, control signals are required for the first pulse oscillator 400a and the second pulse oscillator 400b, respectively.

Meanwhile, it is assumed that an input signal for performing control so that oscillation starts after the left core is turned on first, as shown in FIG. 5, is logic 0, and that an input signal for performing control so that oscillation starts after the right core is turned on first, as shown in FIG. 6, is logic 1.

That is, if it is assumed that the first pulse oscillator 400a inputs signals (the signals of FIG. 5) so that oscillation starts after the left core is turned on first, and that the second pulse oscillator 400b inputs signals (the signals of FIG. 6) so that oscillation starts after the right core is turned on first, control signals $OSC_{400a}$ and $OSC_{400b}$ for the first pulse oscillator 400a and the second pulse oscillator 400b, respectively, can be represented by (0, 1).

Figure 7:
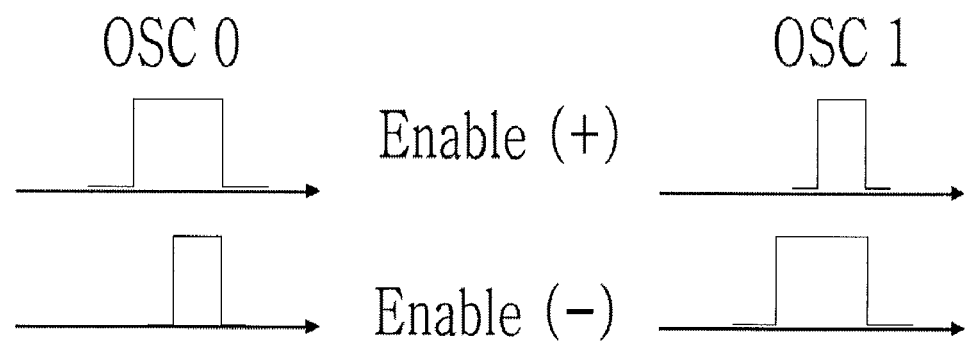
FIG. 7 is a diagram showing an example of the relationships between output phases corresponding to the control signals according to the present invention.

In the case of signals generated by (0, 0), (0, 1), (1, 0) or (1, 1), initial oscillation conditions can be interchanged, so that the phases of oscillation signals can also change and the arrays of the oscillation signals will thus have a quadrature phase therebetween. That is, QPSK modulation can be performed. The relationships between the phases of output signals corresponding to respective input signals are shown in FIG. 7.

Figure 8A:
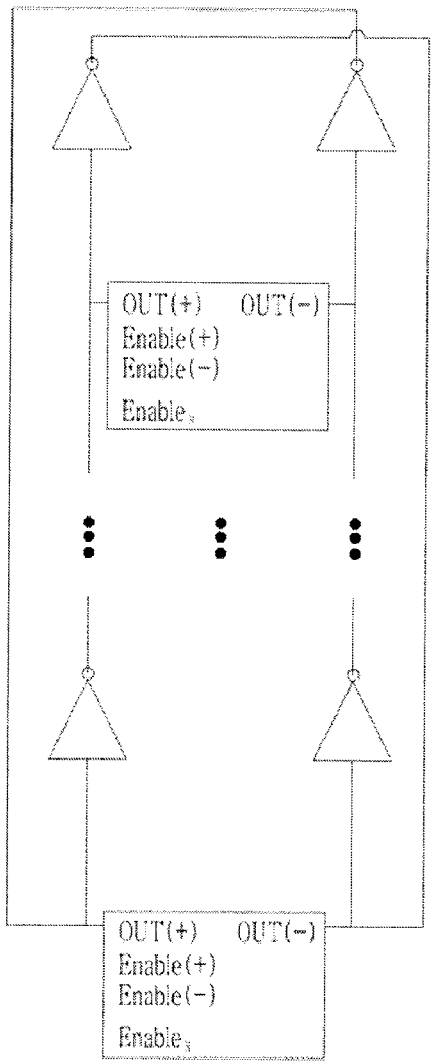
FIGS. 8A and 8B are diagrams showing the construction of a multi-phase ultra-wideband signal generator using an array of a predetermined number of pulse oscillators according to the present invention.
Figure 8B:
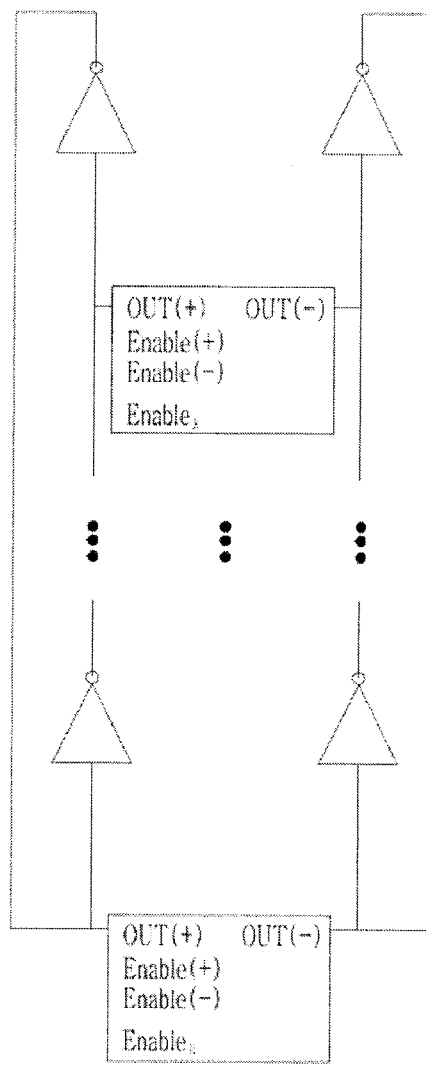

When M-ary PSK (M-PSK) higher than QPSK is required, the ultra-wideband signal generator can be implemented in the form of an array of a larger number of differential pulse oscillators, as shown in FIGS. 8A and 8B. FIG. 8A illustrates an example in which an even number of differential pulse oscillators 400 are arrayed, and FIG. 8B illustrates an example in which an odd number of differential pulse oscillators 400 are arrayed.

That is, when the number of pulse oscillators is an even number, the pulse oscillators are arrayed such that they have a connection form in which the output terminals OUT(+) and OUT(−) of a relevant pulse oscillator are respectively connected to the output terminals OUT(+) and OUT(−) of the next pulse oscillator through a relevant inverting amplification unit, and the connection form is consecutively applied to the pulse oscillators ranging from the first pulse oscillator to the last pulse oscillator. As shown in FIG. 8A, the output terminals OUT(+) and OUT(−) of the last pulse oscillator are respectively connected to the output terminals OUT(−) and OUT(+) of the first pulse oscillator through a relevant inverting amplification unit.

Further, when the number of pulse oscillators is an odd number greater than 1, the pulse oscillators are arrayed such that they have a connection form in which the output terminals OUT(+) and OUT(−) of a relevant pulse oscillator are respectively connected to the output terminals OUT(+) and OUT(−) of the next pulse oscillator through a relevant inverting amplification unit, and the connection form is consecutively applied to the pulse oscillators ranging from the first pulse oscillator to the last pulse oscillator. As shown in FIG. 8B, the output terminals OUT(+) and OUT(−) of the last pulse oscillator are respectively connected to the output terminals OUT(+) and OUT(−) of the first pulse oscillator through a relevant inverting amplification unit. Meanwhile, it can be seen that the structure of FIG. 3 is a case where an even number of differential pulse oscillators 400 are arrayed.

Figure 9:
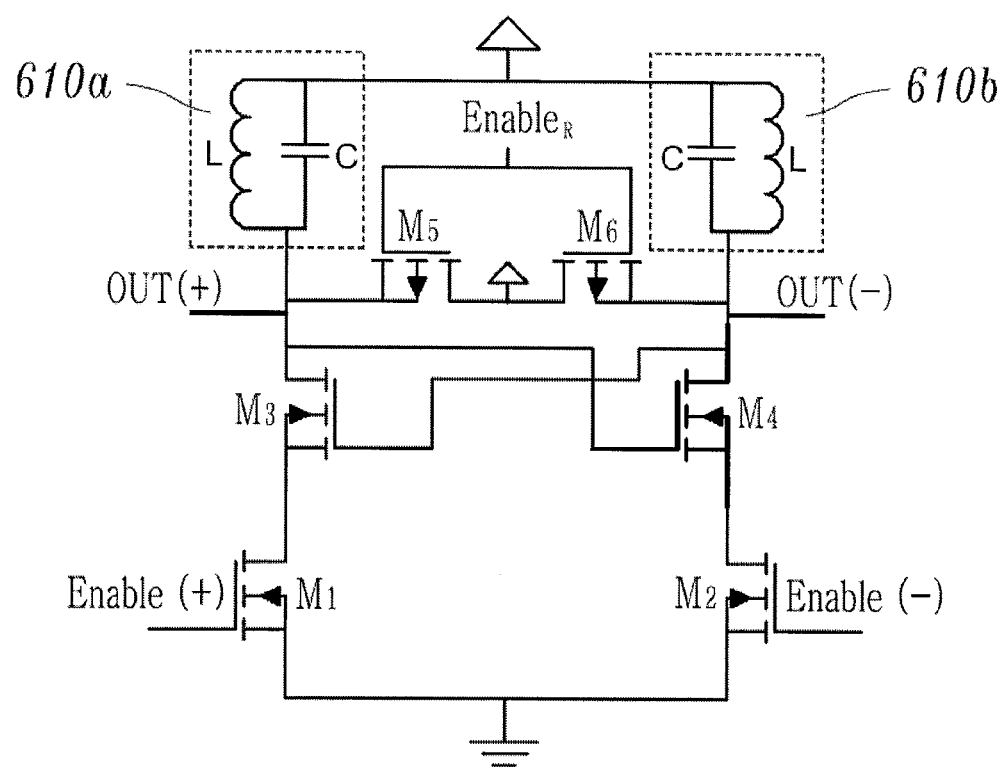
FIG. 9 is a circuit diagram showing the construction of a differential pulse oscillator implemented using CMOS complementary metal oxide semiconductors (CMOS) devices and LC resonators according to an embodiment of the present invention.

FIG. 9 is a circuit diagram showing the construction of a differential pulse oscillator 600 implemented using CMOS devices and LC resonators according to an embodiment of the present invention. The differential pulse oscillator 600 includes a differential oscillator unit including elements 610a, 610b, $M_3$, and $M_4$, and a switch unit including elements $M_1$, $M_2$, $M_5$, and $M_6$.

The elements $M_3$ and $M_4$ are configured such that their drains and gates are cross-coupled to provide negative conductance (−G). Further, the elements $M_3$ and $M_4$ compensate for the loss of the LC resonators 610a and 610b, and thus constitute an LC differential oscillator.

In this case, the differential pulse oscillator has a structure in which power components to be supplied to $M_3$ and $M_4$ are controlled by using $M_1$ and $M_2$, and $M_5$ and $M_6$ are used to reduce a ringing component attributable to a switching operation or to improve a response speed at the time of performing switching.

Figure 10:
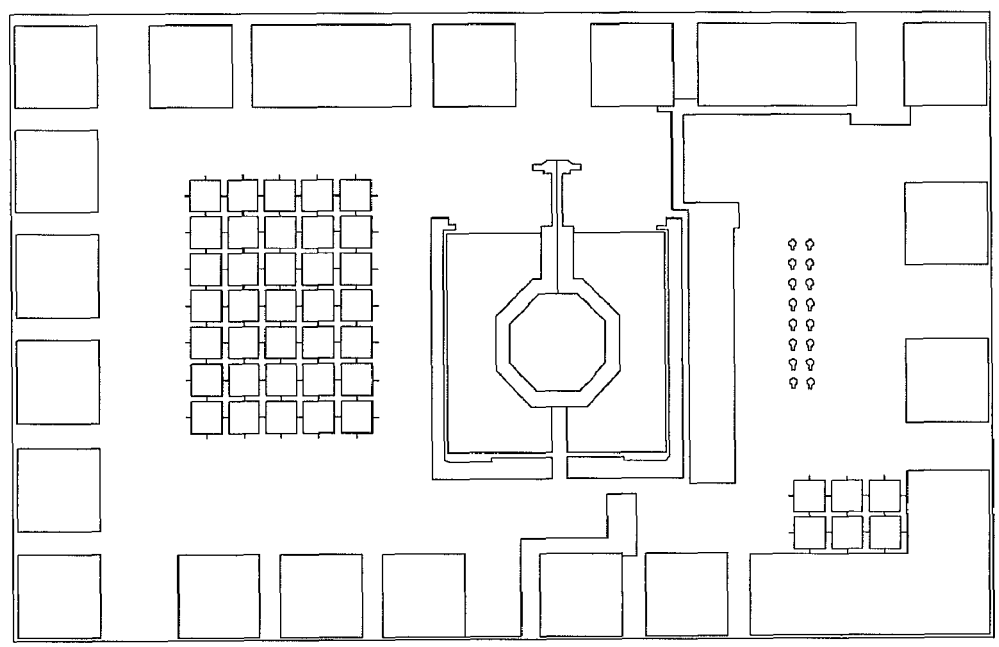
FIG. 10 is a view showing a picture of an ultra-wideband signal generator Integrated Circuit (IC) actually implemented using a CMOS manufacturing process according to an embodiment of the present invention.

FIG. 10 is a diagram showing a picture of a chip obtained by manufacturing the differential pulse oscillator of FIG. 9 using a CMOS manufacturing process. A method of generating ultra-wideband signals according to the present invention can be easily implemented in the form of an Integrated Circuit (IC).

Figure 11:
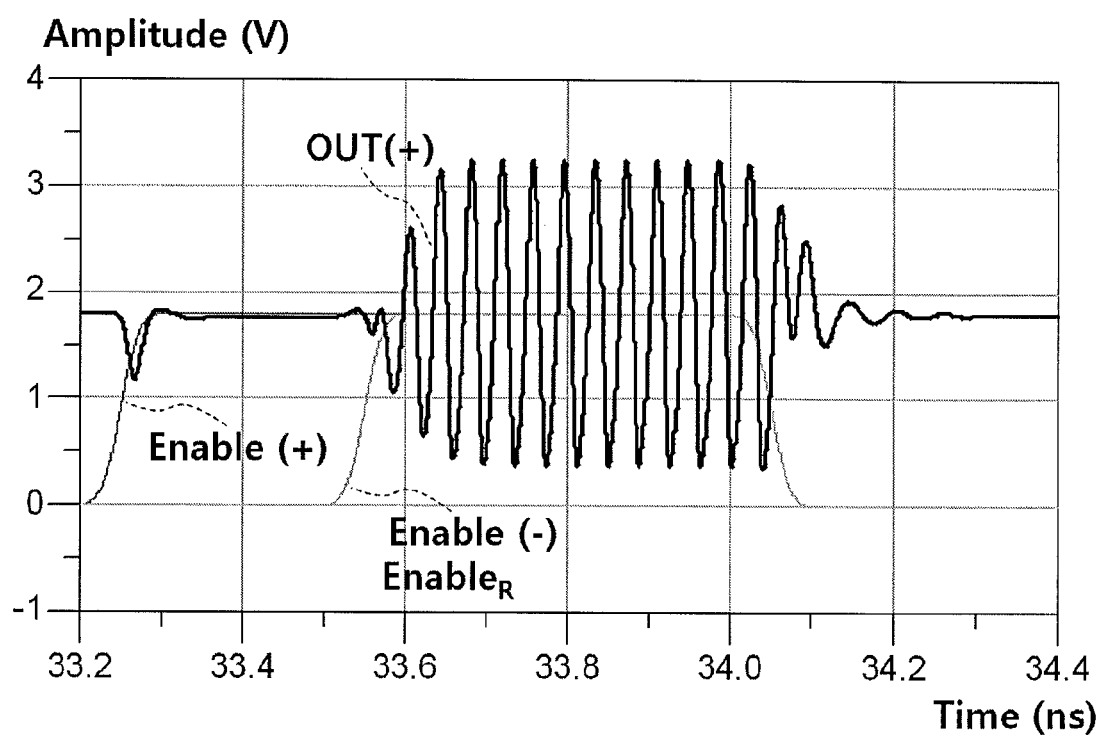
FIG. 11 is a graph showing the results of computer simulation of an actually implemented ultra-wideband signal generator IC, based on the control signals of FIG. 5 according to the present invention.
Figure 12:
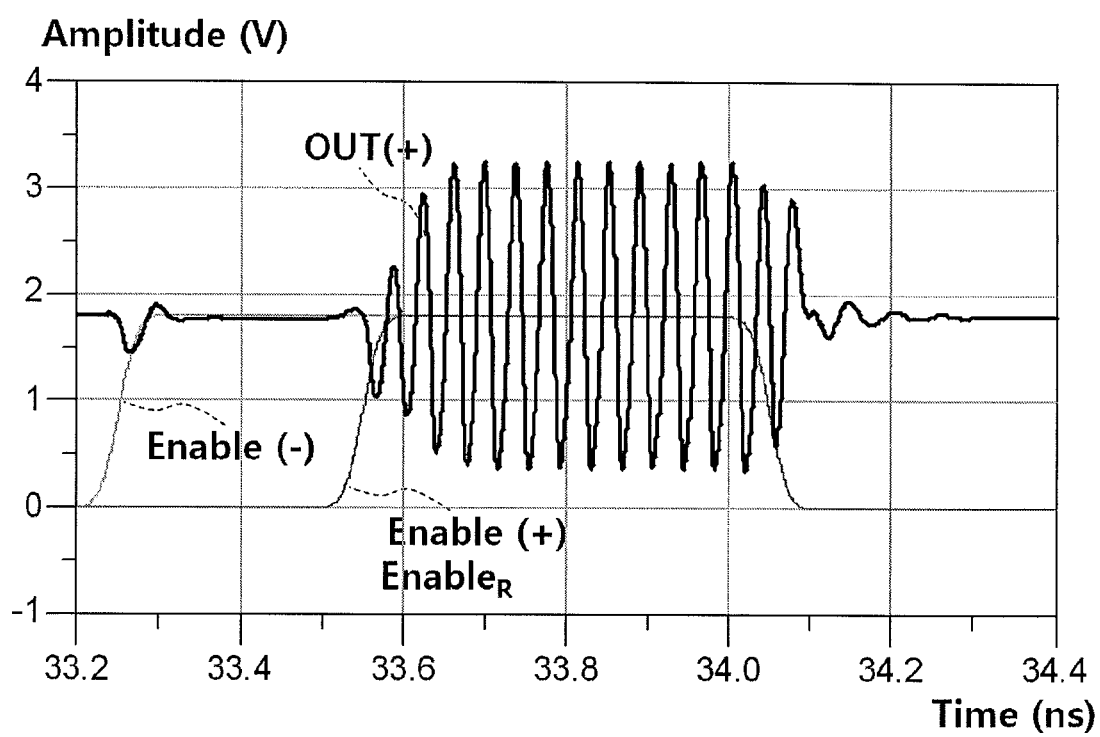
FIG. 12 is a graph showing the results of computer simulation of an actually implemented ultra-wideband signal generator, based on the control signals of FIG. 6 according to the present invention.

FIG. 11 is a diagram showing the results of simulation of the output signal from the output terminal OUT(+) when the control signals of FIG. 5 are applied, and FIG. 12 is a diagram showing the results of simulation of the output signal from the output terminal OUT (+) when the control signals of FIG. 6 are applied.

Figure 13:
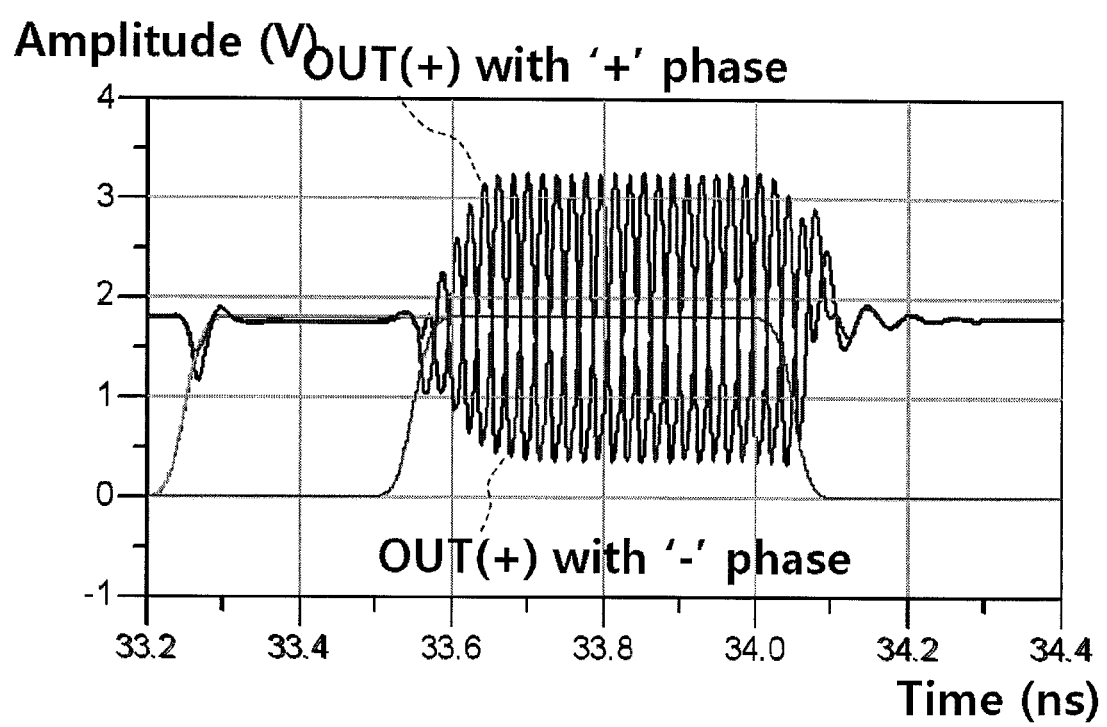
FIG. 13 is a graph showing the comparison between the phases of simulation output signals of FIGS. 11 and 12 according to the present invention.

FIG. 13 is a diagram showing the results obtained by overlapping the simulation output signals of FIGS. 11 and 12 to compare the phases of the simulation output signals. It can be seen in FIG. 13 that the phases of output signals can be changed by 180°, and a fast transient response of about 100 ps is exhibited by using the control signals of FIGS. 5 and 6.

Figure 14:
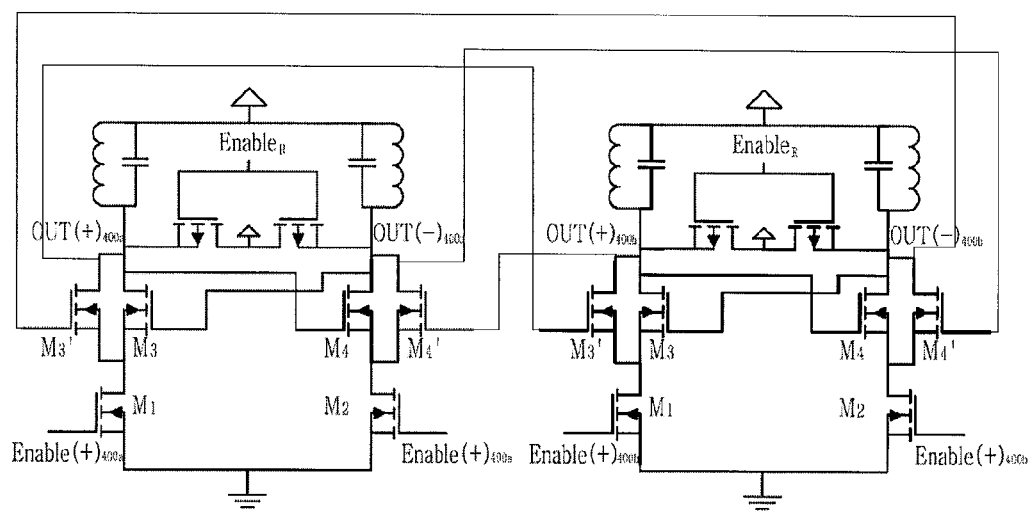
FIG. 14 is a diagram showing the construction of an ultra-wideband signal generator using CMOS devices and LC resonators according to an embodiment of the present invention.

FIG. 14 is a diagram showing the construction of an ultra-wideband signal generator 700 implemented using CMOS devices and LC resonators according to an embodiment of the present invention. The ultra-wideband signal generator 700 includes differential pulse oscillators and inverting amplification units $M_3'$ and $M_4'$ for the configuration of an array.

Figure 15:
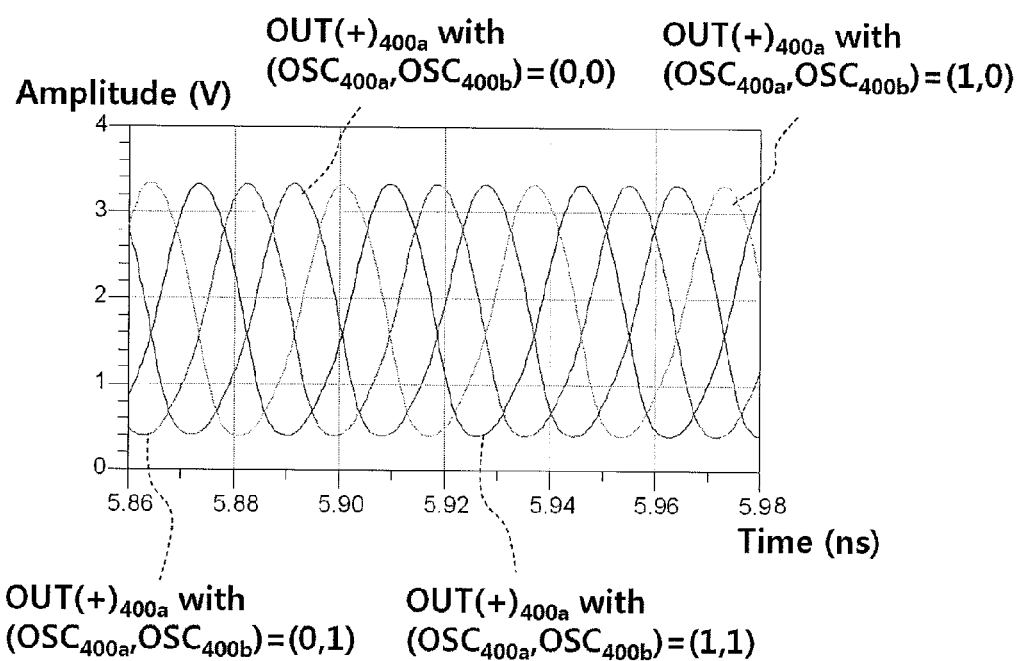
FIG. 15 is a graph showing the results of simulation of output signals from output terminal OUT(+)$_{400a}$ corresponding to the control signals of FIG. 7.

FIG. 15 illustrates the results of simulation of output signals from the output terminal OUT(+) corresponding to the control signals of FIG. 7, and shows the relationships between the phases of the output signals corresponding to input signals.

As described above, when an ultra-wideband signal generator according to the present invention is used, PSK modulation can be performed without requiring a separate modulator, and fast transient response characteristics can be obtained. Therefore, the present invention is advantageous in that it can reduce complexity in the implementation of circuits and costs for implementation, and can enable a radio system having the operating characteristics of low power, high speed and high precision to be implemented.

Although the embodiments of the present invention have been disclosed for illustrative purposes, those skilled in the art will appreciate that various modifications, additions and substitutions are possible, without departing from the scope and spirit of the invention as disclosed in the accompanying claims. Therefore, it should be noted that all suitable modifications, changes and equivalents thereof belong to the scope of the present invention.

What is claimed is:
1. A multi-phase ultra-wideband signal generator using differential pulse oscillators and an array thereof, the multi-phase ultra-wideband signal generator comprising:
a plurality of pulse oscillators configured to generate pulse signals based on a supply of power and being arrayed in a connection form, each of the plurality of pulse oscillators including a plus (+) output terminal and a minus (−) output terminal; and
a plurality of inverting amplification units configured to invert and amplify respective output signals of the plurality of pulse oscillators,
wherein the plus (+) output terminal and the minus (−) output terminal of one of the plurality of pulse oscillators are respectively connected to the plus (+) output terminal and the minus (−) output terminal of a next one of the plurality of pulse oscillators through a respective one of the plurality of inverting amplification units, and the connection form is consecutively applied to the plurality of pulse oscillators ranging from a first one of the plurality of pulse oscillators to a last one of the plurality of pulse oscillators, and
wherein, when the plurality of pulse oscillators comprises an even number of pulse oscillators, the plus (+) output terminals and the minus (−) output terminals of the last one of the plurality of pulse oscillators are respectively connected to the minus (−) output terminal and the plus (+) output terminal of the first one of the plurality of pulse oscillators through a last one of the plurality of inverting amplification units, and wherein, when the plurality of pulse oscillators comprises an odd number of pulse oscillators, the plus (+) output terminal and the minus (−) output terminals of the last one of the plurality of pulse oscillators are respectively connected to the plus (+) output terminal and the minus (−) output terminal of the first one of the plurality of pulse oscillators through the last one of the plurality of inverting amplification units.

2. The multi-phase ultra-wideband signal generator according to claim 1, wherein each of the plurality of pulse oscillators comprises:

an oscillator unit including a resonator, a negative conductance generator, and two equivalent half circuits connected to the AC ground; and a first switch unit configured to control the supply of power, wherein two switches of the first switch unit respectively control the supply of power supplied to the two equivalent half circuits.

3. The multi-phase ultra-wideband signal generator according to claim 2, wherein the two switches of the first switch unit asynchronously control the supply of power respectively supplied to the equivalent half circuits.

4. The multi-phase ultra-wideband signal generator according to claim 2, wherein the two switches of the first switch unit interchange a control sequence of asynchronous control signals with each other and Binary Phase Shift Keying (BPSK) modulation is performed in the plurality of pulse oscillators.

5. The multi-phase ultra-wideband signal generator according to claim 2, wherein the oscillator unit comprises a second switch unit disposed between the resonator and the negative conductance generator to bypass the resonator and configured to reduce a ringing component attributable to a switching operation or improve a response speed at the time of performing switching.

6. The multi-phase ultra-wideband signal generator according to claim 2, wherein the two switches of the first switch unit are one of active element switches or passive element switches.

7. A multi-phase ultra-wideband signal generator comprising:

an oscillator unit including two equivalent half circuits, wherein each of the two equivalent half circuits comprises a resonator and a negative conductance generator; and a first switch unit including two switches and being configured to control power supplied to the oscillator unit, wherein one end of each resonator of the two equivalent half circuits is connected to the ground and another end of each resonator of the two equivalent half circuits is connected to one end of each negative conductance generator of the two equivalent half circuits, wherein another end of each negative conductance generator of the two equivalent half circuits is connected to one end of a respective one of the two switches, and wherein another end of the respective one of the two switches is connected to the ground.

8. The multi-phase ultra-wideband signal generator according to claim 7, wherein the two switches of the first switch unit asynchronously control respective power supplied to the two equivalent half circuits.

9. The multi-phase ultra-wideband signal generator according to claim 7, wherein the oscillator unit further comprises a second switch unit including two switches and one end of each of the two switches of the second switch unit is connected to the one end of each resonator of the two equivalent half circuits.

10. The multi-phase ultra-wideband signal generator according to claim 7, wherein the two switches of the first switch unit are one of active element switches or passive element switches.

11. The multi-phase ultra-wideband signal generator according to claim 7, wherein each resonator of the two equivalent half circuits is LC resonant circuits.

12. A multi-phase ultra-wideband signal generator using differential pulse oscillators and an array thereof, the multi-phase ultra-wideband signal generator comprising:

a plurality of pulse oscillators configured to generate pulse signals based on a supply of power and being arrayed in a connection form, each of the plurality of pulse oscillators including a plus (+) output terminal and a minus (−) output terminal; and a plurality of inverting amplification units configured to invert and amplify respective output signals of the plurality of pulse oscillators, wherein the plus (+) output terminal and the minus (−) output terminal of one of the plurality of pulse oscillators are respectively connected to the plus (+) output terminal and the minus (−) output terminal of a next one of the plurality of pulse oscillators through a respective one of the plurality of inverting amplification units, and the connection form is consecutively applied to the plurality of pulse oscillators ranging from a first one of the plurality of pulse oscillators to a last one of the plurality of pulse oscillators, and wherein, when the plurality of pulse oscillators comprises an even number of pulse oscillators, the plus (+) output terminals and the minus (−) output terminals of the last one of the plurality of pulse oscillators are respectively connected to the minus (−) output terminal and the plus (+) output terminal of the first one of the plurality of pulse oscillators through a last one of the plurality of inverting amplification units, and wherein, when the plurality of pulse oscillators comprises an odd number of pulse oscillators, the plus (+) output terminal and the minus (−) output terminals of the last one of the plurality of pulse oscillators are respectively connected to the plus (+) output terminal and the minus (−) output terminal of the first one of the plurality of pulse oscillators through the last one of the plurality of inverting amplification units, wherein each of the plurality of pulse oscillators comprises:

an oscillator unit including a resonator, a negative conductance generator, and two equivalent half circuits connected to the AC ground; and a first switch unit configured to control the supply of power, wherein two switches of the first switch unit respectively control power supplied to the two equivalent half circuits, wherein the two switches of the first switch unit interchange a control sequence of asynchronous control signals with each other and Binary Phase Shift Keying (BPSK) modulation is performed in the plurality of pulse oscillators, wherein the oscillator unit comprises a second switch unit disposed between the resonator and the negative conductance generator and configured to reduce a ringing component attributable to a switching operation or improve a response speed at the time of performing switching, and wherein the two switches of the first switch unit are one of active element switches or passive element switches.

* * * * *